United States Patent
Scheuerlein

(10) Patent No.: US 7,961,494 B2
(45) Date of Patent: Jun. 14, 2011

(54) NON-VOLATILE MULTI-LEVEL RE-WRITABLE MEMORY CELL INCORPORATING A DIODE IN SERIES WITH MULTIPLE RESISTORS AND METHOD FOR WRITING SAME

(75) Inventor: Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 299 days.

(21) Appl. No.: 12/242,417

(22) Filed: Sep. 30, 2008

(65) Prior Publication Data

US 2009/0257267 A1   Oct. 15, 2009

Related U.S. Application Data

(60) Provisional application No. 61/044,187, filed on Apr. 11, 2008.

(51) Int. Cl.
*G11C 11/00* (2006.01)
(52) U.S. Cl. ...... 365/148; 365/46; 365/100; 365/189.16
(58) Field of Classification Search .................. 365/148, 365/46, 100, 189.16
See application file for complete search history.

(56) References Cited

U.S. PATENT DOCUMENTS

| | | | |
|---|---|---|---|
| 5,787,042 A * | 7/1998 | Morgan | 365/196 |
| 6,473,332 B1 * | 10/2002 | Ignatiev et al. | 365/148 |
| 6,490,218 B1 | 12/2002 | Vyvoda et al. | |
| 6,951,780 B1 | 10/2005 | Herner | |
| 6,987,689 B2 * | 1/2006 | Bozano et al. | 365/148 |
| 7,345,907 B2 | 3/2008 | Scheuerlein | |
| 2005/0040455 A1 | 2/2005 | Bozano et al. | |
| 2005/0158950 A1 | 7/2005 | Scheuerlein et al. | |
| 2006/0157682 A1 | 7/2006 | Scheuerlein | |
| 2006/0250837 A1 | 11/2006 | Herner et al. | |
| 2007/0002603 A1 | 1/2007 | Cleeves | |
| 2007/0008773 A1 | 1/2007 | Scheuerlein | |
| 2007/0072360 A1 | 3/2007 | Kumar et al. | |
| 2007/0090425 A1 | 4/2007 | Kumar et al. | |
| 2007/0132049 A1 | 6/2007 | Stipe | |
| 2007/0164272 A1 | 7/2007 | Yang et al. | |
| 2007/0228354 A1 | 10/2007 | Scheuerlein | |
| 2007/0236981 A1 | 10/2007 | Herner | |
| 2008/0025088 A1 | 1/2008 | Scheuerlein et al. | |
| 2009/0026433 A1 | 1/2009 | Chiang | |

(Continued)

OTHER PUBLICATIONS

International Search Report and Written Opinion mailed Nov. 30, 2009, for International App. No. PCT/US2009/040187, 6 pages.

(Continued)

*Primary Examiner* — Pho M Luu
(74) *Attorney, Agent, or Firm* — Zagorin O'Brien Graham LLP

(57) ABSTRACT

A very dense cross-point memory array of multi-level read/write two-terminal memory cells, and methods for its programming, are described. Multiple states are achieved using two or more films that each have bi-stable resistivity states, rather than "tuning" the resistance of a single resistive element. An exemplary memory cell includes a vertical pillar diode in series with two different bi-stable resistance films. Each bi-stable resistance film has both a high resistance and low resistance state that can be switched with appropriate application of a suitable bias voltage and current. Such a cross-point array is adaptable for two-dimensional rewritable memory arrays, and also particularly well-suited for three-dimensional rewritable (3D R/W) memory arrays.

24 Claims, 8 Drawing Sheets

U.S. PATENT DOCUMENTS

2009/0086521 A1    4/2009    Herner et al.

OTHER PUBLICATIONS

Adee, Sally, "The Mysterious Memristor," IEEE Spectrum online, May 1, 2008, 3 pages, URL: <http://www.spectrum.ieee.org/may08/6207>.

Lee, Seungjae et al., "A 3.3V 4Gb Four-Level NAND Flash Memory with 90nm CMOS Technology," ISSCC 2004, Session 2, Non-Volatile Memory, 2.7, including visual supplements, Feb. 16, 2004, 13 pages.

Sim, Hyunjun, et al., in "Resistance switching characteristics of polycrystalline $Nb_2O_5$ for nonvolatile memory application," IEEE Elect. Dev. Lett. 26, 292 (2005), 3 pages.

Seo, S. et al., in "Electrode dependence of resistance switching in polycrystalline NiO films," Applied Physics Letters, vol. 87, Issue 26, id. 263507, Dec. 29, 2005, 3 pages.

Seo, S. et al., in "Reproducible resistance switching in polycrystalline NiO films," Applied Physics Letters, vol. 85, Issue 23, id. 5655, Dec. 6, 2004, 3 pages.

* cited by examiner

BISTABLE SWITCHING OF NiO FILM

BISTABLE SWITCHING OF $Nb_2O_5$ FILM

MULTIPLE RESISTORS WITH OVERLAPPING $I_{SET}$ AND $I_{RESET}$ CURRENTS

MULTIPLE RESISTORS WITH NON-OVERLAPPING $I_{SET}$ AND $I_{RESET}$ CURRENTS

STATE 00 → 01

CHOOSE $I_{LIMIT1}$ SUCH THAT: $I_{RESET2} > I_{LIMIT1} > I_{SET1}$ ; REACH $V_{SET2}$

STATE 01 → 00

CHOOSE $I_{LIMIT} > I_{RESET2}$ ; REACH $V_{RESET2}$ ; STAY BELOW $V_{SET2}$

STATE 00 → 1X

CHOOSE $I_{LIMIT3}$ SUCH THAT: $I_{RESET4} > I_{LIMIT3} > I_{SET3}$ ; REACH $V_{SET1}$

STATE 01 → 1X

CHOOSE $I_{LIMIT3}$ SUCH THAT: $I_{RESET4} > I_{LIMIT3} > I_{SET3}$ ; REACH $V_{SET1}$

STATE 10 → 11

CHOOSE $I_{LIMIT1}$ SUCH THAT: $I_{RESET2} > I_{LIMIT1} > I_{SET1}$ ; REACH $V_{NEWSET2}$

STATE 11 → 10

CHOOSE $I_{LIMIT4}$ SUCH THAT: $I_{RESET5} > I_{LIMIT4} > I_{RESET4}$ ; REACH $V_{NEWRESET2}$

STATE 1X → 0X

CHOOSE $I_{LIMIT} > I_{RESET5}$ ; CHOOSE $V_{SET1} > V > V_{NEWSET2}$

NON-VOLATILE MULTI-LEVEL RE-WRITABLE MEMORY CELL INCORPORATING A DIODE IN SERIES WITH MULTIPLE RESISTORS AND METHOD FOR WRITING SAME

CROSS-REFERENCE TO RELATED APPLICATION(S)

This application claims the benefit under 35 U.S.C. §119 (e) of U.S. Provisional Application No. 61/044,187 filed on Apr. 11, 2008 by Roy Scheuerlein, et al., entitled "Carbon Based Switching Element for 3D Memory," the disclosure of which is incorporated by reference herein in its entirety.

BACKGROUND

1. Field of the Invention

The present invention relates to non-volatile memory cell arrays, and more particularly to cross-point memory arrays storing more than one bit of information in each memory cell.

2. Description of the Related Art

Non-volatile memory arrays have found widespread use in many commercial and consumer devices. For decades, engineers have sought ways to increase the density and reduce the cost of such devices. Historically, these efforts have resulted in the use of larger numbers of layers, each with smaller and smaller feature sizes, to squeeze more and more bits of memory onto a single integrated circuit. Certain memory devices include more than one memory plane to help increase the density and/or lower the cost per bit.

Such cost-reduction efforts also include increasing the number of bits stored in each memory cell. Memory cells capable of storing 2 or more bits of information are frequently called "multi-level" memory cells, because typically such memory cells are programmed by changing a particular device characteristic to a desired one of many different analog levels, such as a transistor threshold voltage, or a value of resistance. For example, a memory cell having four different programmable values of resistance, or four different programmable values of threshold voltage, can store 2 bits of information.

Multi-level memory cells have been achieved in using a floating gate transistor memory cell structure, and also using transistors incorporating charge storage dielectric material, such as SONOS, in a traditional two-dimensional (2D) memory array using single crystal transistors formed in a semiconductor substrate, and also in a more advanced three-dimensional (3D) stackable memory array using thin-film transistors formed in one or more layers above a semiconductor substrate. However, such memory cells are three terminal devices, which limits the density that is achievable because three wires must be routed through the array and reach each memory cell, or such memory cells must be configured in a series arrangement (e.g., NAND flash memory arrays).

Cross-point arrays have also been fabricated that store multiple bits within a single memory cell. Some of these multi-level memory cells include a single element which is tuned to a particular value of resistance. In U.S. Pat. No. 6,490,218 to Vyvoda, et al., a multi-level memory cell is described which includes a single antifuse whose resistance is "tunable" to several different values of resistance. In U.S. Patent Publication No. 2007-0002603 by Cleeves, a multi-level memory cell is described which includes a single antifuse which is "popped" in a reverse direction, and then tuned in a forward direction to a particular value of resistance. In U.S. Patent Publication No. 2007-0090425 by Kumar, et al., a multi-level memory cell is described which includes a single polysilicon resistor element (PVM) which is tuned to a particular value of resistance. In U.S. Patent Publication No. 2006-0250837 by Herner, et al., a multi-level memory cell is described which includes a single reversible NiOx element. Multiple bits are stored into a single variable resistor material by writing that one resistor material at different currents or voltages. Programming is achieved by applying a programming pulse, checking the resistance achieved, and re-pulsing the cell to "tune" the memory element to a particular value of resistance.

Other multi-level memory cells include two elements, one of which may be tuned to a particular value of resistance. In U.S. Patent Publication No. 2007-0228359 by Herner, a multi-level memory cell is described which includes an antifuse and a single reversible resistance change material. In U.S. Patent Publication No. 2007-0072360 by Kumar, et al., a multi-level memory cell is described which includes an antifuse and a single NiOx element, and achieves a partially OTP and partially re-writable memory cell. In U.S. patent application Ser. No. 11/864,870 filed on Sep. 28, 2007 by Herner, et al., a multi-level memory cell is described which includes two antifuses with different programming characteristics. Each of the antifuses is one-time-programmable, as the resistance of each antifuse decreases with each additional programming pulse. One particular combination includes a first very leaky antifuse, and a second very resistive antifuse, so that a programming voltage may be developed across one antifuse while the other antifuse is unprogrammed.

Each of these known two-terminal multi-level memory cells either makes use of careful tuning of a single memory element, and/or includes an antifuse that renders at least one of the bits stored therein one-time-programmable (i.e., non-rewritable).

SUMMARY

A very dense cross-point memory array of multi-level read/write two-terminal memory cells, and methods for its programming, are described in which multiple states are achieved using two or more films that each have bi-stable resistivity states. An exemplary memory cell includes a vertical pillar diode in series with two different bi-stable films. Each bi-stable resistance film has both a high resistance and low resistance state that can be switched with appropriate application of a suitable bias voltage and current, and without requiring any analog "trimming" of the resistance. An exemplary cross-point array is adaptable for two-dimensional rewritable memory arrays, and also particularly well-suited for three-dimensional rewritable (3D R/W) memory arrays.

In one aspect the invention provides a memory device which, in an exemplary embodiment, includes a cross-point memory array comprising a plurality of array lines of a first type and a plurality of array lines of a second type, and a plurality of two-terminal memory cells each coupled between an associated array line of the first type and an associated array line of the second type. Each memory cell comprises a first bi-stable resistive element, a second bi-stable resistive element, and a current-steering device coupled together in series, and each bi-stable resistive element is settable from a high to a low resistance value, and resettable from a low to a high resistance value.

In another aspect the invention provides a method for programming a two-terminal cross-point memory cell within a memory array with multiple data bits, said memory cell comprising first and second bi-stable resistive elements coupled in series with a current-steering device, in which each bi-stable resistive element is settable from a high to a low resistance value, and resettable from a low to a high resistance value. In an exemplary embodiment, the method includes applying one of a first group of voltage/current conditions on the memory cell to program the first bi-stable resistive element to a desired data state, even though such voltage/current conditions may result in an unpredictable data state written to the second bi-stable resistive element; and then applying one of a second group of voltage/current conditions on the memory cell to program the second bi-stable resistive element to a desired data state without disturbing the data state of the first bi-stable resistive element, wherein current flow through the memory cell is limited in each of the second group of voltage/current conditions to a smaller magnitude than in any of the first group of voltage/current conditions.

In another aspect the invention provides a method for programming a two-terminal cross-point memory cell with multiple data bits, said memory cell comprising first and second bi-stable resistive elements coupled in series with a current-steering device, each bi-stable resistive element being settable from a high to a low resistance value by the passage of a set current therethrough, and resettable from a low to a high resistance value by the passage of a reset current therethrough. In an exemplary embodiment, the method includes causing a current to flow through the memory cell that exceeds one of the set and reset currents for the element having a higher reset current, to program said element having the higher reset current; then causing a lesser current to flow through the memory cell to program the element having the lower reset current.

In another aspect the invention provides a method for making a memory product. In an exemplary embodiment, the method includes forming a cross-point memory array comprising a plurality of array lines of a first type and a plurality of array lines of a second type, and a plurality of two-terminal memory cells each coupled between an associated array line of the first type and an associated array line of the second type. Each memory cell comprises a first bi-stable resistive element, a second bi-stable resistive element, and a current-steering device coupled together in series, and each bi-stable resistive element is settable from a high to a low resistance value, and resettable from a low to a high resistance value.

The invention in several aspects is particularly suitable for implementation within an integrated circuit, including those integrated circuits having a memory array, for methods for operating such circuits, for systems incorporating such circuits, and for computer readable media encodings of such circuits, all as described herein in greater detail and as set forth in the appended claims. A wide variety of such integrated circuits is specifically contemplated, particularly those incorporating programmable memory arrays, including those having a monolithic three-dimensional memory array having more than one memory plane formed above a substrate.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. Moreover, the inventive aspects described herein are contemplated to be used alone or in combination. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
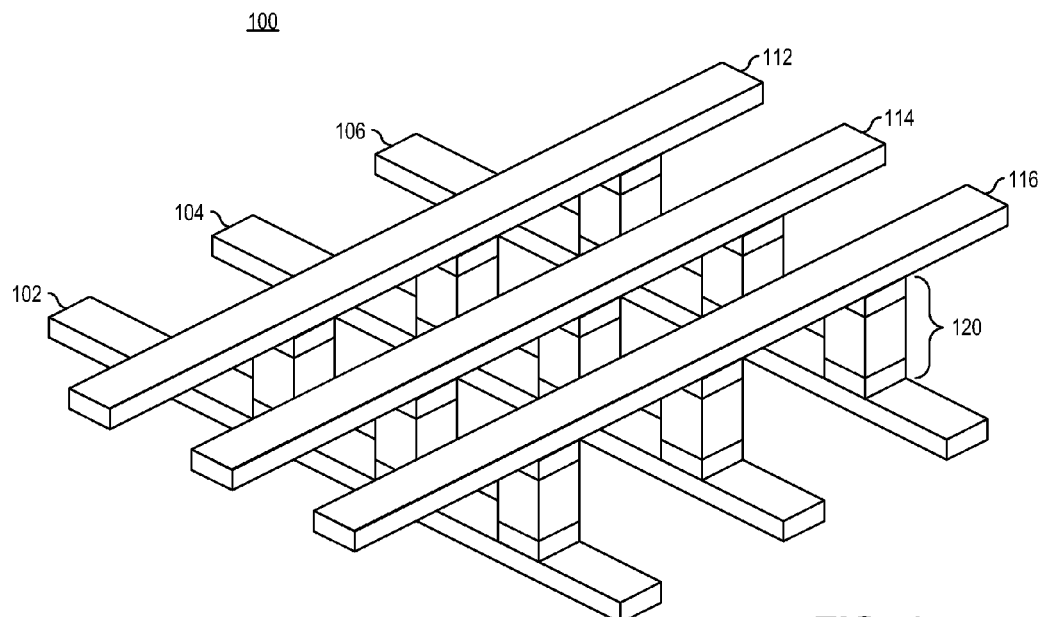
FIG. 1 is an isometric diagram of an exemplary cross-point memory array of multi-level memory cells, in accordance with certain embodiments of the present invention.

Referring now to FIG. 1, a memory array 100 is depicted in accordance with the present invention, which shows three X-lines 102, 104, 106, and three Y-lines 112, 114, 116. At every crossing of an X-line and a Y-line, a two-terminal memory cell 120 is coupled between the corresponding X-line and Y-line.

Figure 2:
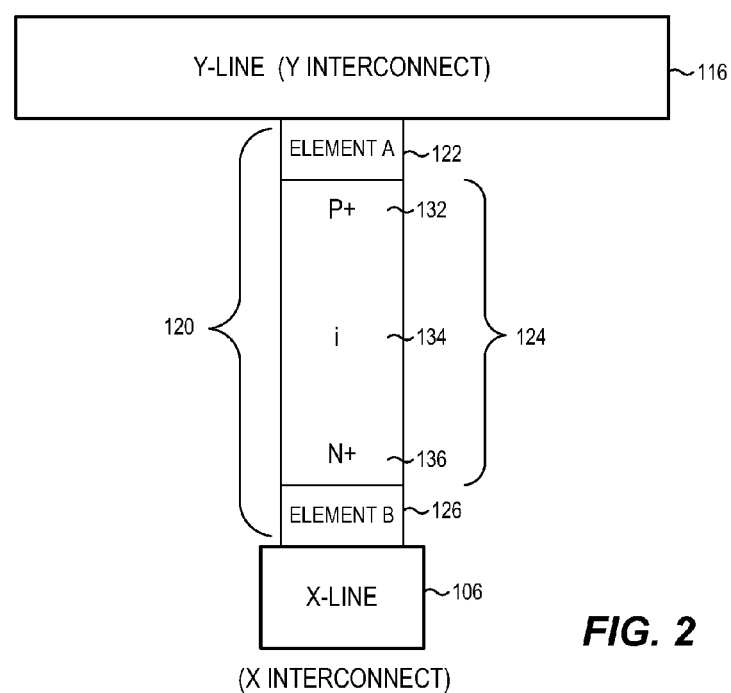
FIG. 2 is a cross-sectional diagram of an exemplary multi-level memory cell depicted in FIG. 1.

Referring now to FIG. 2, a cross-sectional view of an exemplary memory cell 120 is shown. The memory cell 120 includes a vertical pillar diode 124, a first bi-stable resistive element 122 disposed between the diode 124 and the Y-line 116, and a second bi-stable resistive element 126 disposed between the diode 124 and the X-line 106. The pillar diode 124 includes at the upper end thereof a P+ region 132, at the lower end thereof an N+ region 136, and in the middle region thereof an intrinsic region 134. Exemplary pillar diode structures and methods of their manufacture are described in U.S. Pat. No. 6,951,780 to Herner, the disclosure of which is incorporated herein by reference in its entirety. Preferably a TiN diffusion barrier (not shown) is implemented between the vertical pillar diode 124 and each of the first bi-stable resistive element 122 and the second bi-stable resistive element 126.

Figure 3A:
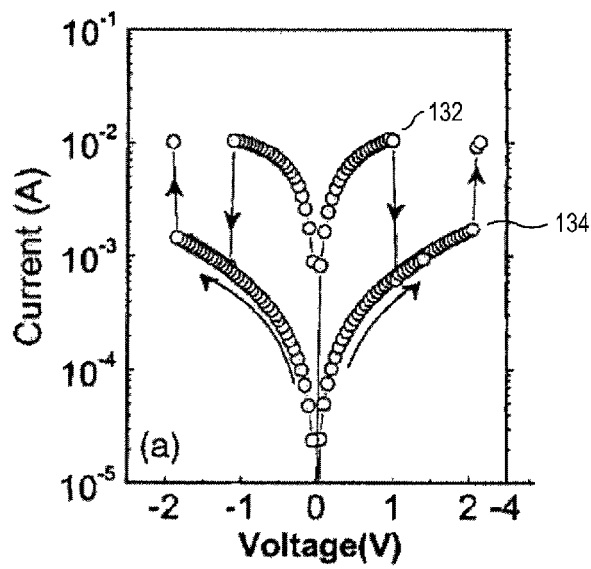
FIGS. 3A-3B are graphs which depict bi-stable switching of films known in the art.
Figure 3B:
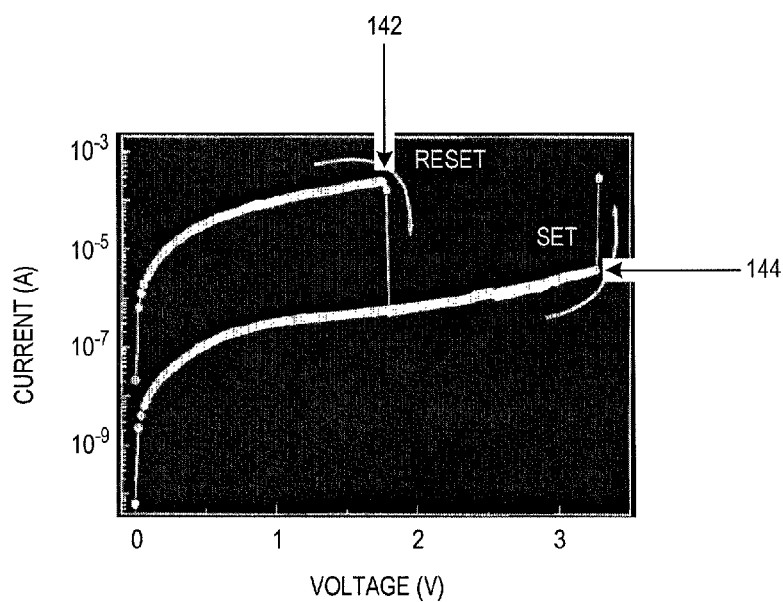

Each bi-stable resistive element 122, 126 may be switched between two different resistance states by application of high bias voltage, as described below. As used herein, the set voltage corresponds to that voltage which changes the resistance of the element from its higher resistance value to its lower resistance value, and the reset voltage corresponds to that voltage which changes the resistance of the element from its lower resistance value to its higher resistance value. Each bi-stable resistive element is formed by a film of appropriate resistance change material. Exemplary film materials which exhibit bi-stable switching include NiO and $Nb_2O_5$. FIG. 3A shows the current-voltage characterization of a particular NiO film by S. Seo, et al., in "Reproducible resistance switching in polycrystalline NiO films," *Appl. Phys. Lett.* 85, 5655 (2004). The reset voltage (labeled 132) is ~1.1 V and the set voltage (labeled 134) is 2.1 V for this particular NiO film. FIG. 3B shows the current voltage characterization of a particular $Nb_2O_5$ film by H. Si, et al., in "Resistance switching characteristics of polycrystalline $Nb_2O_5$ for nonvolatile memory application," *IEEE Elect. Dev. Lett.* 26, 292 (2005). The reset voltage (labeled 142) is 1.9 V and the set voltage (labeled 142) is 3.2 V for this particular $Nb_2O_5$ film.

The set and reset voltages can be modified by the choice of electrode material, as shown by S. Seo et al., in "Electrode dependence of resistance switching in polycrystalline NiO films," *Appl. Phys. Lett.* 87, 263507 (2005). In addition, the set and reset voltages may be modified by appropriate choice of film thickness, and cross-sectional area of the element. For example, NiO may be used for both bi-stable elements if their set and reset voltages are appropriately configured, as described below. The composition of the metal oxide film can also influence the set and reset voltages (e.g. Ni:O ratio in NiO), providing further flexibility in adjusting the set and reset voltages for each memory element, while both remain largely composed of NiO. Moreover, many other resistance change materials may be used, either alone or in combination with other resistance change materials, for example chalcogenides, perovskites, or other metal oxides, as further described below.

As may be appreciated in view of FIGS. 1 and 2, the memory array achieves very high density for several reasons. First, such two terminal memory cells may be configured in a cross-point array. Since the steering element is a vertical pillar diode, and the two bi-stable memory elements are formed as part of the pillar, the cell may be formed having a very tall, narrow aspect ratio, which lends itself to achieving a very tight array line pitch for both X-lines and Y-lines, with the basic one layer cell having a size of $4F^2$, where F is the feature size. Density is further improved by storing two or more bits in one cell. Density may be further improved by implementing more than one memory plane on top of one another to achieve ultra high 3D memory density, having an equivalent (effective) 2D cell size of $4F^2/n$, where n is the number of memory planes.

However, as a two-terminal memory cell incorporating two different bi-stable resistive elements, the current through both memory elements is always the same, and there is no ability to control the voltage of the pillar diode nodes between the two elements, and hence there is no ability to independently control the voltage across either memory element. Programming such a memory cell may consequently require careful attention, and not all choices of resistive elements may be as useful as others. Moreover, as described below, programming the two elements may be required in a particular sequence, rather than in any order.

Figure 4:
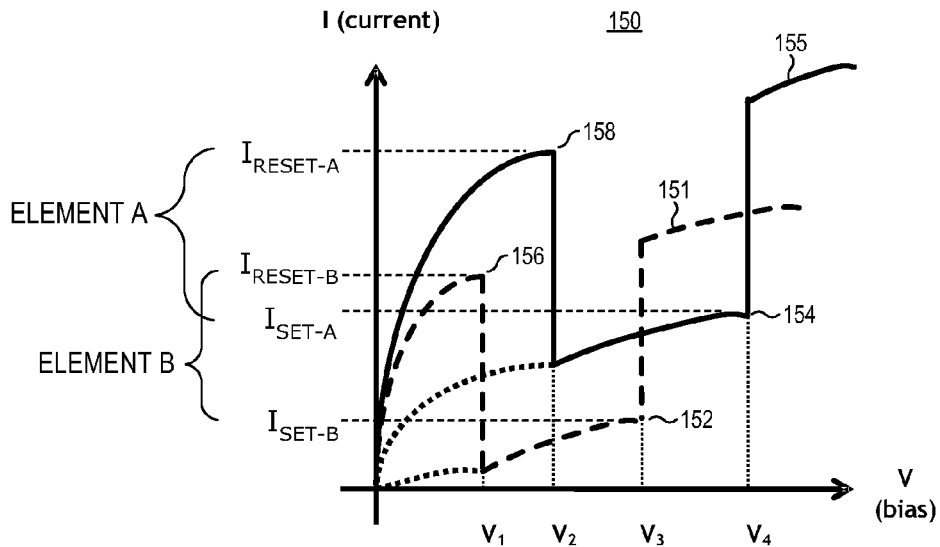
FIG. 4 is an I-V diagram of bi-stable switching for two different films having overlapping set and reset voltages and overlapping set and reset currents.

To illustrate this point, FIG. 4 is an I-V diagram of bi-stable switching for two different resistive elements having overlapping set and reset voltages and overlapping set and reset currents (i.e., also called interleaved set and reset currents). In this figure, the I-V characteristics of each resistive element (described as Element A and Element B) are shown independent of one another and the diode current steering device. As can be seen, element A switches from a high conductivity (low resistance) state to a low conductivity (high resistance) state at bias voltage $V_2$ (i.e., VresetA), and switches back to a high conductivity state at bias voltage $V_4$ (i.e., VsetA). Element B switches from a high conductivity (low resistance) state at bias voltage $V_1$ (i.e., VresetB) and switches back to a high conductivity state at bias voltage $V_3$ (i.e., VsetB). In this example, note that VresetB<VresetA<VsetB<VsetA because these two elements have overlapping set and reset voltages, and note that IsetB<IsetA<IresetB<IresetA because these two elements have overlapping set and reset current.

When these two elements are placed in series, the current through each is the same. The lower curve (i.e., highest resistance) on the graph either due to element A or element B largely determines the total current through both elements, although there is some effect from the higher curve (i.e., lowest resistance). For ease of description, assume that both elements are initially in their high resistance (reset) state. When the current (I) increases to a value of IsetB (voltage/current point 152), element B "sets" to its low resistance state. After switching, the current through the memory cell may be limited so that the current through element A stays below IsetA and the voltage across element A stays below VsetA (voltage/current point 154), and thus element A may remain undisturbed.

However, if we try to reset element B by increasing the current I to a value of IresetB (voltage/current point 156), we disturb element A at a lower current (point 154) before we reach voltage/current point 156. As a result, one cannot achieve a memory cell state in which element A is in its high resistance state (i.e., "off") and element B is in its low resistance state (i.e., "on"). In addition, if we set element A to its low resistance state, element B is necessarily also set to its low resistance state, and we cannot achieve a state in which element B remains in its high resistance state.

This FIG. 4 graphically illustrates that, in a memory cell incorporating a diode plus more than one bi-stable (i.e., "switchable resistor") non-volatile memory cell, not all combinations of bi-stable resistor states are achievable. A write method is needed to reliably attain more than two states.

Figure 5:
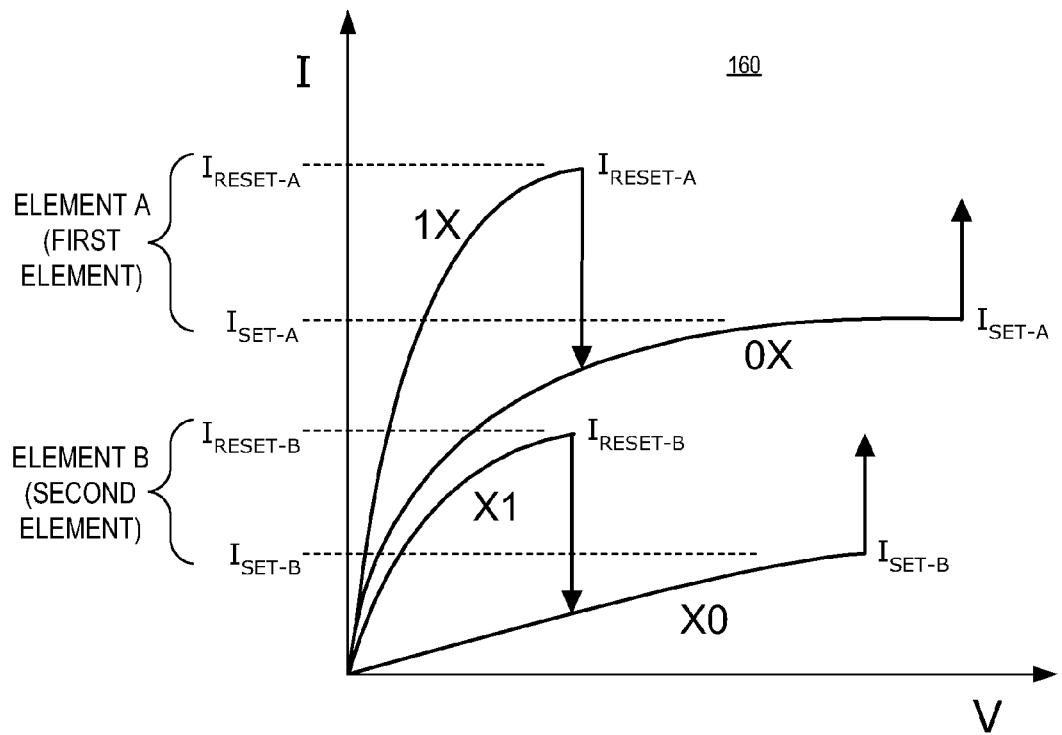
FIG. 5 is an I-V diagram of bi-stable switching for two different films having non-overlapping set and reset currents.

However, four different resistance states may be achieved in such a memory cell using two bi-stable resistive elements in series with a single current steering device (i.e., a passive element memory cell with two switchable elements) where the set current and reset current of a first element are both higher than the set current and reset current of a second element, as shown in FIG. 5. In other words, these two elements have non-overlapping set and reset (i.e., programming) currents such that IsetB<IresetB<IsetA<IresetA. In such a case, writing element A having the higher set and reset currents (i.e., the "first" element) will interfere with element B having the lower set and reset currents (i.e., the "second" element). Significantly, however, the converse is not true: writing the second element B having the lower set and reset currents will not interfere with the first element A having the higher set and reset currents. Two elements A and B having non-overlapping programming currents may be achieved, for example, by using a first element formed from NiOx and second element formed from TiOx.

In the series configuration of the memory cell, the set and reset voltages applied to each of the switching elements are determined by the resistance of each element, along with the current flowing through both elements. These set and reset voltages can interleave or overlap, but controlling the cell current helps provide for independent programming of each element, as described below.

Figure 6:
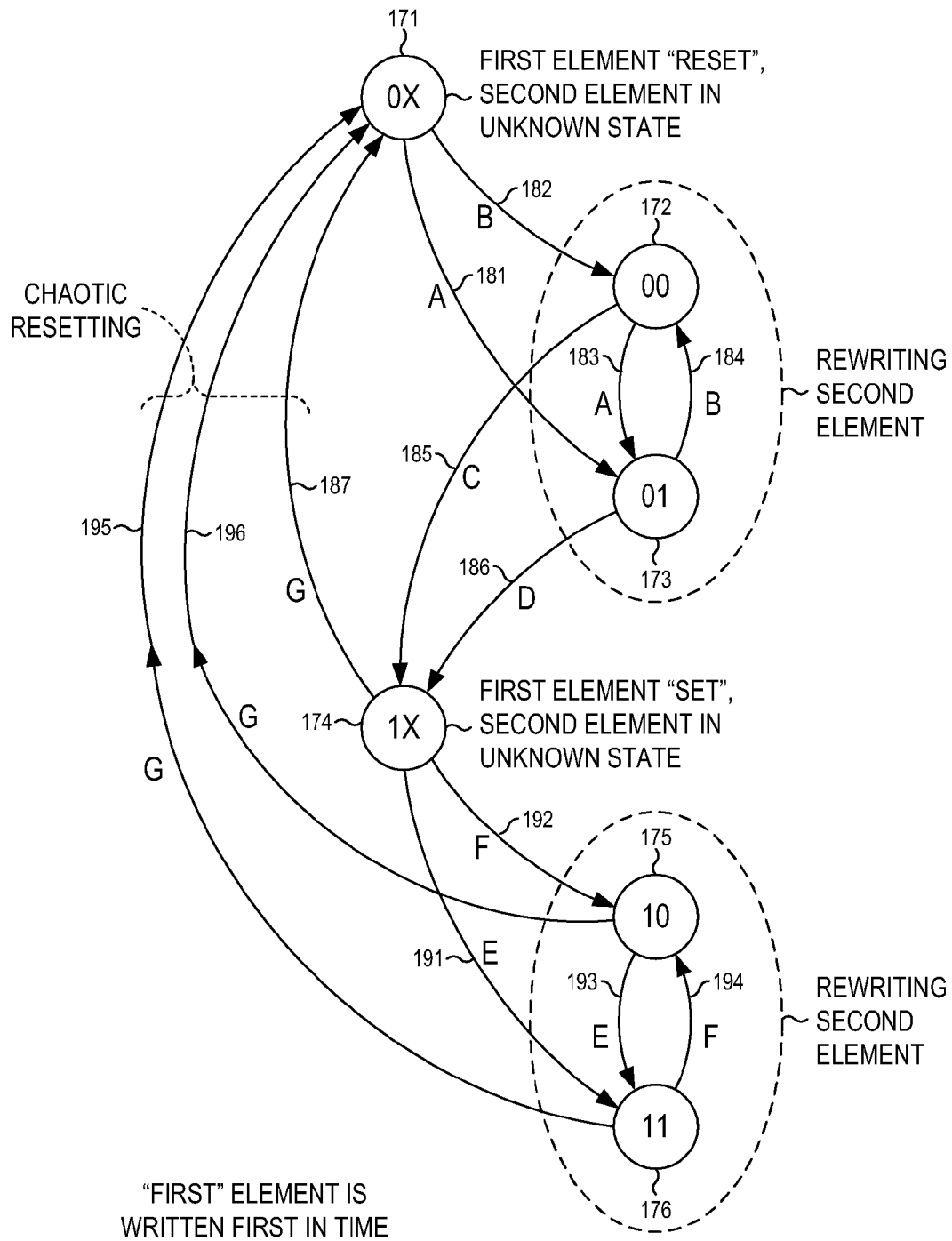
FIG. 6 is a state diagram illustrating an exemplary programming sequence for independently writing first and second elements in a two-terminal memory cell.

Referring now to FIG. 6, a programming sequence diagram 170 is shown which illustrates an exemplary method of sequentially programming a multi-level memory cell, as described above, in which the two bi-stable resistive elements have non-overlapping programming currents. This diagram will be briefly introduced, but more fully explained in the context of the several figures that follow. Each state in this diagram is labeled with a two digit symbol representing the memory state of each resistive element. The first digit represents the first element having the higher programming currents, while the second digit represents the second element having the lower programming currents. Each resistive element is indicated as being a "0" (high resistance or "reset" state), or a "1" (low resistance or "set" state), or an "X" (unknown state). In subsequent figures, the 00, 01, 10, and 11 states may be shown as R00, R01, R10, and R11.

The 0X state 171 corresponds to the first element being "reset" in its high resistance state, and the second element being in an unknown (either a "0" or a "1") state. The 1X state 174 corresponds to the first element being "set" in its low resistance state, and the second element being in an unknown state. The 00 state 172 corresponds to the first and second elements being "reset" in their respective high resistance states. The 01 state 173 corresponds to the first element being "reset" in its high resistance state, and the second element being "set" in its low resistance state. The 10 state 175 corresponds to the first element being "set" in its low resistance state, and the second element being "reset" in its high resistance state. Lastly, the 11 state 176 corresponds to the first and second elements being "set" in their respective low resistance states.

As will be appreciated from the following description, the first element is first programmed to its desired value, which potentially disturbs the second element, then the second element is programmed (or re-programmed) to its desired value. Programming a new value into just the first element may be accomplished by reading the memory cell and storing the present value of the second element in support circuits, then programming the first element to its desired value, then re-programming the second element back to its original value. Programming a new value into just the second element may be accomplished by directly programming the second element to its desired value, without disturbing the first element. In other words, irrespective of the first element's state, the second element may be programmed from a "1" to a "0", and also from a "0" to a "1" (i.e., between the R00 and R01 states, or between the R10 and R11 states).

Assume, for this description, that the memory cell is initially in the 0X state 171. From this state, the second element may be programmed to "1" (and thereby follow transition 181 to the 01 state 173) by applying programming conditions "A" to the memory cell. Such programming conditions "A" are described in greater detail below in regards to FIG. 7A. Alternatively, the second element may be programmed to "0" (and thereby follow transition 182 to the 00 state 172) by applying programming conditions "B" to the memory cell (described in greater detail below in regards to FIG. 7B). The second element may be programmed from a "0" to a "1" (transition 183) or from a "1" to a "0" (transition 184) by applying these same programming conditions "A" and "B" to thereby transition between the 00 state 172 and the 01 state 173.

From the 00 state 172, the first element may be programmed to "1" (and thereby follow transition 185 to the 1X state 174) by applying programming conditions "C" to the memory cell (described in greater detail below in regards to FIG. 7C). Similarly, from the 01 state 173, the first element may be programmed to "1" (and thereby follow transition 186 to the 1X state 174) by applying programming conditions "D" to the memory cell (described in greater detail below in regards to FIG. 7D).

Programming the first element to a "1" and reaching the 1X state 174 potentially disturbs the second element, and at least renders its state unknown, so the second element may then be written or re-written to its desired value. From the 1X state 174, the second element may be programmed to "1" (and thereby follow transition 191 to the 11 state 176) by applying programming conditions "E" to the memory cell (described in greater detail below in regards to FIG. 7E). Alternatively, the second element may be programmed to "0" (and thereby follow transition 192 to the 10 state 175) by applying programming conditions "F" to the memory cell (described in greater detail below in regards to FIG. 7F). The second element may be programmed from a "0" to a "1" (transition 193) or from a "1" to a "0" (transition 194) by applying these same programming conditions "E" and "F" to thereby transition between the 10 state 175 and the 11 state 176.

Programming the first element to a "0" and reaching the 0X state 171 potentially disturbs the second element, and at least renders its state unknown, so the second element may then be written or re-written to its desired value, as described above. From the 1X state 174, the first element may be "reset" to "0" (and thereby follow transition 187 to the 0X state 171) by applying programming conditions "G" to the memory cell (described in greater detail below in regards to FIG. 7G). Similarly, from the 10 state 175 and the 11 state 176, the first element may be programmed to "0" (and thereby follow respective transitions 196 and 195 to the 0X state 171) by applying the same programming conditions "G" to the memory cell. As described below in greater detail, application of the programming conditions "G" results in a "chaotic resetting" of the first element because multiple applications of such programming conditions "G" may be necessary before the first element actually reaches the "0" state (i.e., the reset state).

Figure 7A:
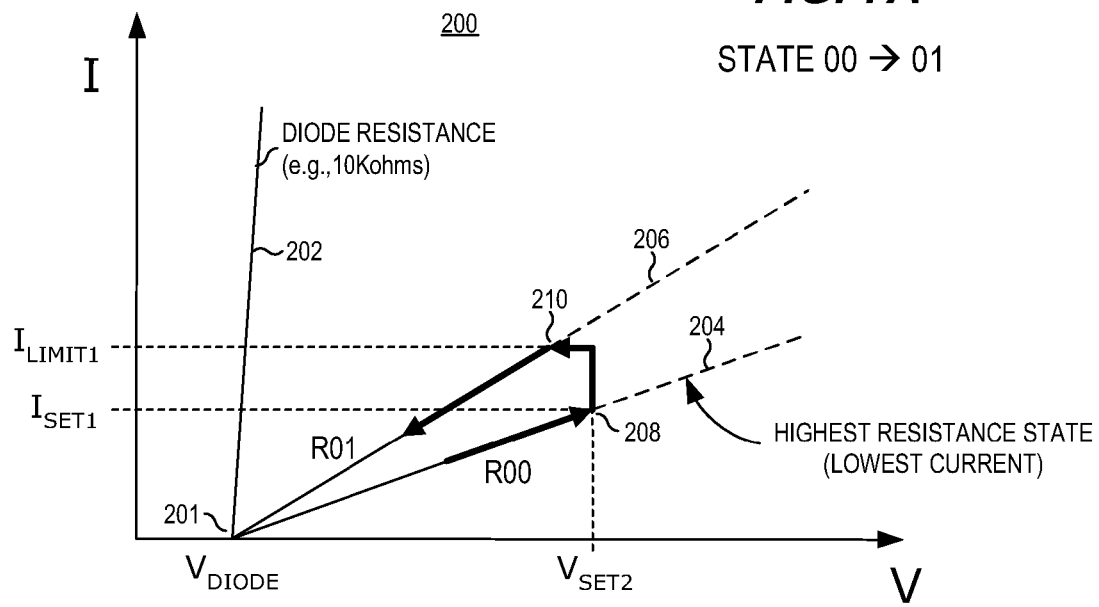
FIGS. 7A-7G are IV curves, each depicting conditions for writing an exemplary two-element, two-terminal memory cell from one to another of the states shown on FIG. 6, and correspond to the state transition labels indicated in FIG. 6.

Referring now to FIG. 7A, the programming conditions "A" are depicted for setting the second element, while the first element remains reset. This corresponds to the transition 181 from the 0X state 171 to the 01 state 173, and to the transition 183 from the 00 state 172 to the 01 state 173. Unlike the previous diagrams above which depict the set and reset voltage and current for the first element independently of those for the second element (and independently of the diode resistance), FIG. 7A and the related figures that follow represent an I-V diagram of the combined memory cell having the first and second elements in series with the diode. In addition, while the state diagram in FIG. 6 depicts several states in which one of the resistive elements is in an unknown state, the diagrams that follow show each of four states that the two elements may represent, since each element is actually either in its set state or reset state, even though the element's state may not be known.

Three lines are depicted in this figure. The first line 202 represents the IV curve for the diode within the memory cell. No current flows until the voltage reaches a $V_{DIODE}$ voltage (labeled 201), which typically is approximately 0.8 volts. Once current flows through the diode, the diode resistance is preferably almost insignificant relative to both resistive elements in the memory cell. In this figure, the diode resistance is assumed to be approximately 10K ohms, which is shown as a nearly vertical line because the vertical scale is linear rather than logarithmic.

The second line shown is R00 line 204 which corresponds to the memory cell in the R00 state, in which both the first and second elements are currently reset in their "0" state. The R00 state is the highest resistance (lowest current) state for the two elements. The third line shown is R01 line 206 which corresponds to the memory cell in the R01 state, in which the first element is currently reset in its "0" state, and the second element is currently set in its "1" state.

Assume that the memory cell is currently in the R00 state. When voltage is applied across the memory cell (by a voltage differential between a selected X-line and a selected Y-line), no current flows until the voltage exceeds the $V_{DIODE}$ voltage, then the bias point traverses up the R00 line 204, shown by the bold arrow in the figure. When the voltage across the second element reaches its set voltage, the second element switches to its set state. In the figure, this corresponds to $V_{SET2}$, which is actually larger than the actual set voltage of the second element since both elements are in series (with some voltage division between the two elements) and also in series with the diode (which does not conduct until the $V_{DIODE}$ voltage is reached).

When the second element reaches its set voltage and set current (at bias point 208 with $V_{SET2}$ and $I_{SET1}$), its resistance abruptly changes to a lower resistance, and the bias point abruptly transitions up toward the R01 line 206. However, by limiting current through the memory cell, the voltage across the second element may be maintained below its reset voltage, so that the second element stays in its set state. Thus, before reaching the R01 line 206 at a bias point directly above bias point 208, the current limit forces the memory cell to bias point 210 on the R01 line 206 corresponding to an $I_{LIMIT1}$ current limit value. As the voltage is then reduced (as the voltage between the selected X-line and Y-line is reduced), the bias point follows the R01 line 206 back toward the $V_{DIODE}$ point 201. The role of this current limit is particularly important since the applied programming voltage usually far exceeds the $V_{SET2}$ voltage to ensure adequate programming. Preferably, the magnitude of this $I_{LIMIT1}$ current limit is chosen so that $I_{RESET2} > I_{LIMIT1} > I_{SET1}$ as will be made more clear in view of the next figure.

Figure 7B:
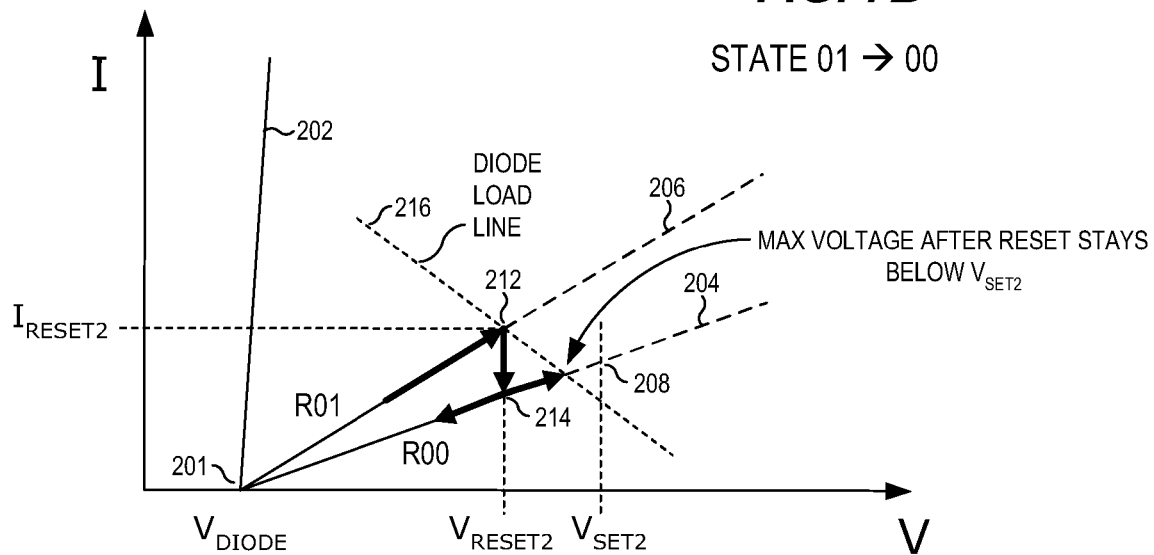

Referring now to FIG. 7B, the programming conditions "B" are depicted for resetting the second element, while the first element remains reset. This corresponds to the transition 182 from the 0X state 171 to the 00 state 172, and to the transition 184 from the 01 state 173 to the 00 state 172. Assume that the memory cell is currently in the R01 state. When voltage is applied across the memory cell, the bias point traverses up the R01 line 206, shown by the bold arrow in the figure. When the bias point of the second element reaches its reset voltage and reset current (at bias point 212, $V_{RESET2}$ and $I_{RESET2}$), its resistance abruptly changes to a higher resistance, and the bias point abruptly transitions down to the R00 line 204 at bias point 214. As before, $V_{RESET2}$ is actually larger than the actual reset voltage of the second element.

The danger at this point is that the voltage across the memory cell may reach the $V_{SET2}$ voltage, at which point the second element would switch right back to its set state. This cannot be prevented by limiting the programming current to a value below $I_{SET}$, because the reset current $I_{RESET2}$ that must be allowed to flow through the memory cell to accomplish the reset is greater than the set current $I_{SET1}$. However, by choosing an appropriate diode load line 216, the maximum voltage along the R00 line 204 that can be reached after the second element resets can be limited to a value lass than $V_{SET2}$, and thus ensure that the second element remains reset. In other words, the diode load line 216 ensures that the bias point 208 cannot be reached. After programming, as the cell voltage is then reduced, the bias point follows the R00 line 204 back toward the $V_{DIODE}$ point 201. Preferably, the cell current is again limited during this operation, but in this case chosen so that $I_{LIMIT} > I_{RESET2}$. The upper limit of this $I_{LIMIT}$ current is made more clear in the description below. The actual programming voltage may be approximately 400-500 mV higher than the $V_{SET2}$ voltage because of the voltage drop across the diode.

Figure 7C:
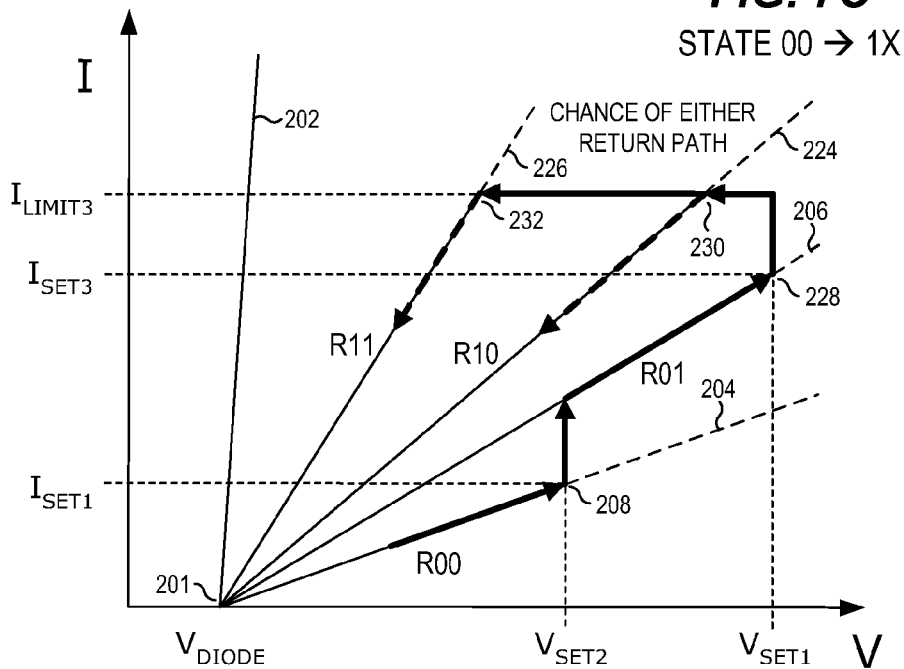

Referring now to FIG. 7C, the programming conditions "C" are depicted for setting the first element when the second element is already reset. This corresponds to the transition 185 from the 00 state 172 to the 1X state 174. The R10 line 224 corresponds to the memory cell in the R10 state, in which the first element is currently set in its "1" state, and the second element is currently reset in its "0" state. The R11 line 226 corresponds to the memory cell in the R11 state, in which the first and second elements are currently set in their "1" state. The R11 state is the lowest resistance (highest current) state for the two elements.

Assume that the memory cell is currently in the R00 state. When voltage is applied across the memory cell, the bias point traverses up the R00 line 204, shown by the bold arrow in the figure. When the cell voltage reaches bias point 208 ($V_{SET2}$ and $I_{SET1}$), the second element abruptly changes to a lower resistance state, and the current abruptly transitions up to the R01 line 206. This time, however, the current is not prevented from reaching the R01 line, and the bias point traverses farther along the R01 line 206 as additional voltage is applied across the memory cell. When the first element reaches its set voltage and set current (at bias point 228 with $V_{SET1}$ and $I_{SET3}$), its resistance abruptly changes to a lower resistance, and the bias point begins to abruptly transition up either the R10 line 224 or the R11 line 226. However, by limiting current through the memory cell, the voltage across the first element may be maintained below its reset voltage, so that the first element stays in its set state. Thus, before reaching the R10 line 224 at a bias point directly above bias point 228, the current limit forces the memory cell to either bias point 230 on the R10 line 224, or to bias point 232 on the R11 line 226, both corresponding to an $I_{LIMIT3}$ current limit value. As the cell voltage is then reduced, the bias point follows either the R10 line 224 or the R11 line 226 back toward the $V_{DIODE}$ point 201. Preferably, the magnitude of this $I_{LIMIT1}$ current limit is chosen so that $I_{RESET4} > I_{LIMIT3} > I_{SET3}$ as will be made more clear in view of the figures that follow.

This figure represents a predictable transition to set the first element, even though the second element state becomes unpredictable. However, lower voltages may then be used to achieve a predictable transition on the second element. The unpredictability of the second element may be influenced by differences in switching characteristics of the first element compared to the second element. For example, one element may switch more quickly than the other, and the resulting state of the second element may be affected by programming pulse widths, and voltage transition rates (i.e., ramp-up and ramp-down times) on the selected X-line and/or selected Y-line.

Figure 7D:
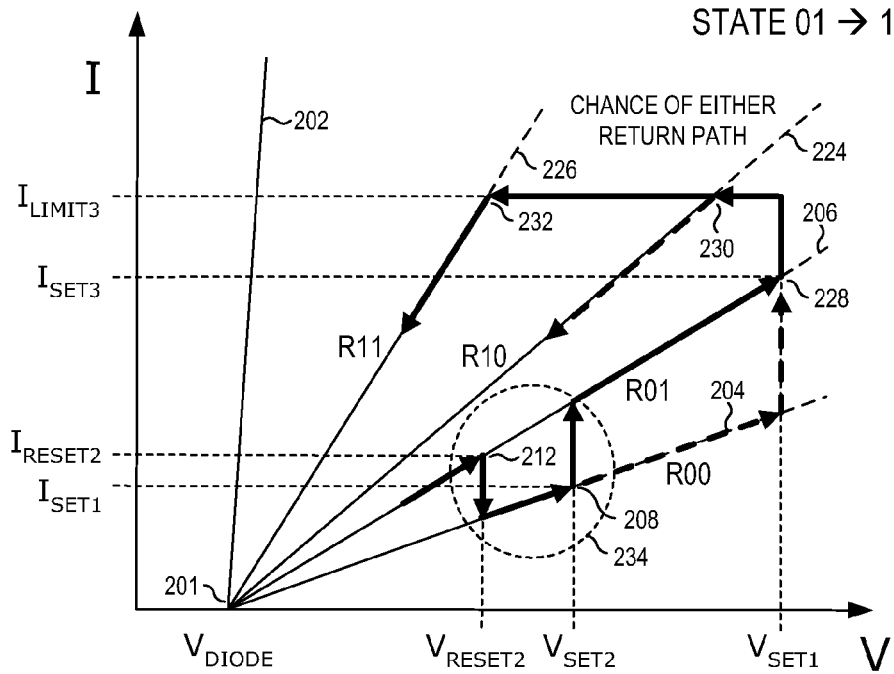

Referring now to FIG. 7D, the programming conditions "D" are depicted for setting the first element when the second element is already set. This corresponds to the transition 186 from the 01 state 173 to the 1X state 174. Assume that the memory cell is currently in the R01 state. When voltage is applied across the memory cell, the bias point traverses up the R01 line 206. When the bias point of the second element reaches its reset voltage and reset current (at bias point 212, $V_{RESET2}$ and $I_{RESET2}$), its resistance abruptly changes to a higher resistance, and the bias point abruptly transitions down to the R00 line 204 at bias point 214. Without the effect of diode load line 216, the bias point continues traversing up the R00 line 204. When the cell voltage reaches bias point 208 ($V_{SET2}$ and $I_{SET1}$), the second element abruptly changes to a lower resistance state, and the current abruptly transitions up to the R01 line 206, as described above. With additional applied cell voltage, and with the appropriate $I_{LIMIT3}$ current limit, the first element is set, although the second element becomes unpredictable, as described above. As the cell voltage is then reduced, the bias point follows either the R10 line 224 or the R11 line 226 back toward the $V_{DIODE}$ point 201.

There exists a region 234 of unpredictability depicted in this figure that warrants mention. Depending upon the switching characteristics of the second element, the second element may not actually switch back to its set state when the cell voltage reaches $V_{SET2}$, and the bias point may instead continue up the R00 line 204 (shown in a dashed arrow) until the cell voltage reaches $V_{SET1}$, whereupon the first element is set. In such a case, the second element may still be in its reset state, and thus the memory cell more likely jump to the bias point 230 (along the R10 line 224) than to bias point 232 (along the R11 line 226). For example, one element may switch more quickly than the other, and the resulting state of the second element may be affected by programming pulse widths, and voltage transition rates (i.e., ramp-up and ramp-down times) on the selected X-line and/or selected Y-line. Depending upon how long it takes to reach the $I_{SET3}$ current, it is indeterminate which of the two states the second element assumes. For example, if the voltage across the memory cell increases with a very slow transition time, the second element may have enough time to reset at bias point 212, then to set at bias point 208, and eventually arrive at bias point 232 along the R11 line 226. Alternatively, during a slow transition, the state of the second element may repeatedly set and then reset, and thereby "oscillate" between its two states, which renders its final state very difficult to predict. As another example, if the first element sets and resets very quickly, but the second element requires longer times to set and reset, then the first element may be more likely programmed without necessarily disturbing the second element if very short programming pulses are used, and the second element may be programmed using longer, but lower magnitude, programming pulses.

Figure 7E:
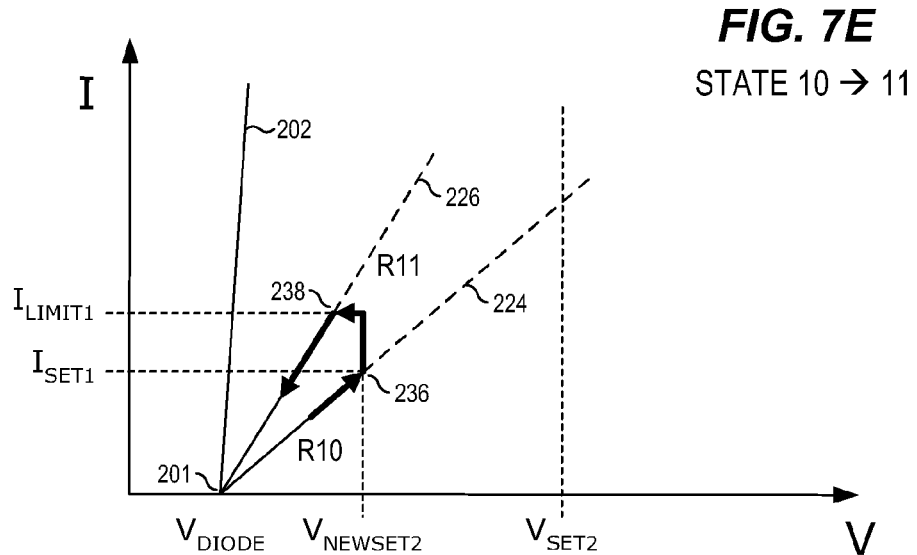

Referring now to FIG. 7E, the programming conditions "E" are depicted for setting the second element, while the first element remains set. This corresponds to the transition 191 from the 1X state 174 to the 11 state 176, and to the transition 193 from the 10 state 175 to the 11 state 176. Assume that the memory cell is currently in the R10 state. When the applied cell voltage exceeds the $V_{DIODE}$ voltage, the bias point traverses up the R10 line 224. When the voltage across the second element reaches its set voltage and set current (at bias point 236), the second element switches to its set state. In this figure, this bias point 236 corresponds to $V_{NEWSET2}$, which is lower than the $V_{SET2}$ shown in FIG. 7A above (e.g., by perhaps 100 mV for certain exemplary resistive elements) because the first element is now in a more conductive (lower resistance) state. This bias point 236 also corresponds to $I_{SET1}$, which is identical to that shown in FIG. 7A because it still corresponds to the second element's set current, which is unaffected by the change in resistance of the first element.

Upon reaching memory cell bias point 236, the second element's resistance abruptly changes to a lower resistance, and the bias point abruptly transitions up toward the R11 line 226. However, before reaching the R11 line 226 at a bias point directly above bias point 236, the $I_{LIMIT1}$ current limit is again employed which forces the memory cell to bias point 238 on the R11 line 226. By limiting current through the memory cell, the voltage across the second element may be maintained below its reset voltage, so that the second element stays in its set state. Thus, as the cell voltage is then reduced, the bias point follows the R11 line 226 back toward the $V_{DIODE}$ point 201. Preferably, the magnitude of this $I_{LIMIT1}$ current limit is chosen, as before, so that $I_{RESET2} > I_{LIMIT1} > I_{SET1}$.

Figure 7F:
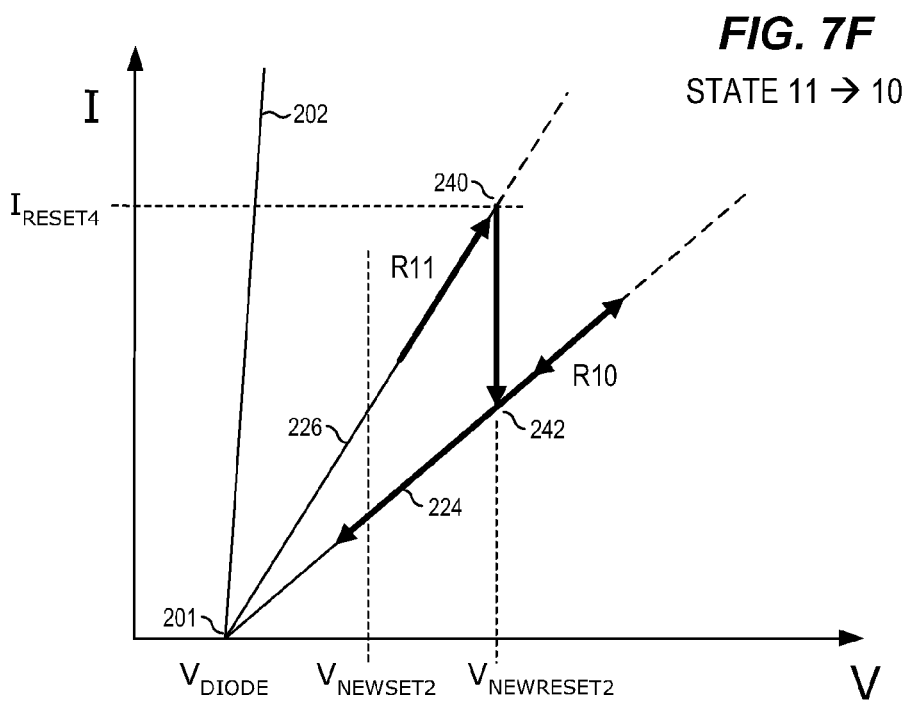

Referring now to FIG. 7F, the programming conditions "F" are depicted for resetting the second element, while the first element remains set. This corresponds to the transition 192 from the 1X state 174 to the 10 state 175, and to the transition 194 from the 11 state 176 to the 10 state 175. Assume that the memory cell is currently in the R11 state. When sufficient voltage is applied across the memory cell, the bias point traverses up the R11 line 226. When the bias point of the second element reaches its reset voltage and reset current (at memory cell bias point 240, $V_{NEWRESET2}$ and $I_{RESET4}$), the second element's resistance abruptly changes to a higher resistance, and the bias point abruptly transitions down to the R10 line 224 at bias point 242. As before, $V_{NEWRESET2}$ is actually greater than the actual reset voltage of the second element. Also, $V_{NEWRESET2}$ is less than the $V_{RESET2}$ shown in FIG. 7A above because the first element is now in a more conductive (lower resistance) state than in FIG. 7A. Preferably, the cell current is again limited during this operation, but in this case chosen so that $I_{RESET5} > I_{LIMIT4} > I_{RESET4}$. The upper limit $I_{RESET5}$ is made more clear in the description below. Because of the high magnitude of the reset current $I_{RESET4}$, only the R10 state is stable, and as the cell voltage is then reduced, the bias point follows the R10 line 224 back toward the $V_{DIODE}$ point 201.

It should be noted that FIG. 7E and FIG. 7F are respectively similar to, except shifted to the left, relative to FIG. 7A and FIG. 7B, because of the steeper IV curve of the first element in its set state than in its reset state.

Figure 7G:
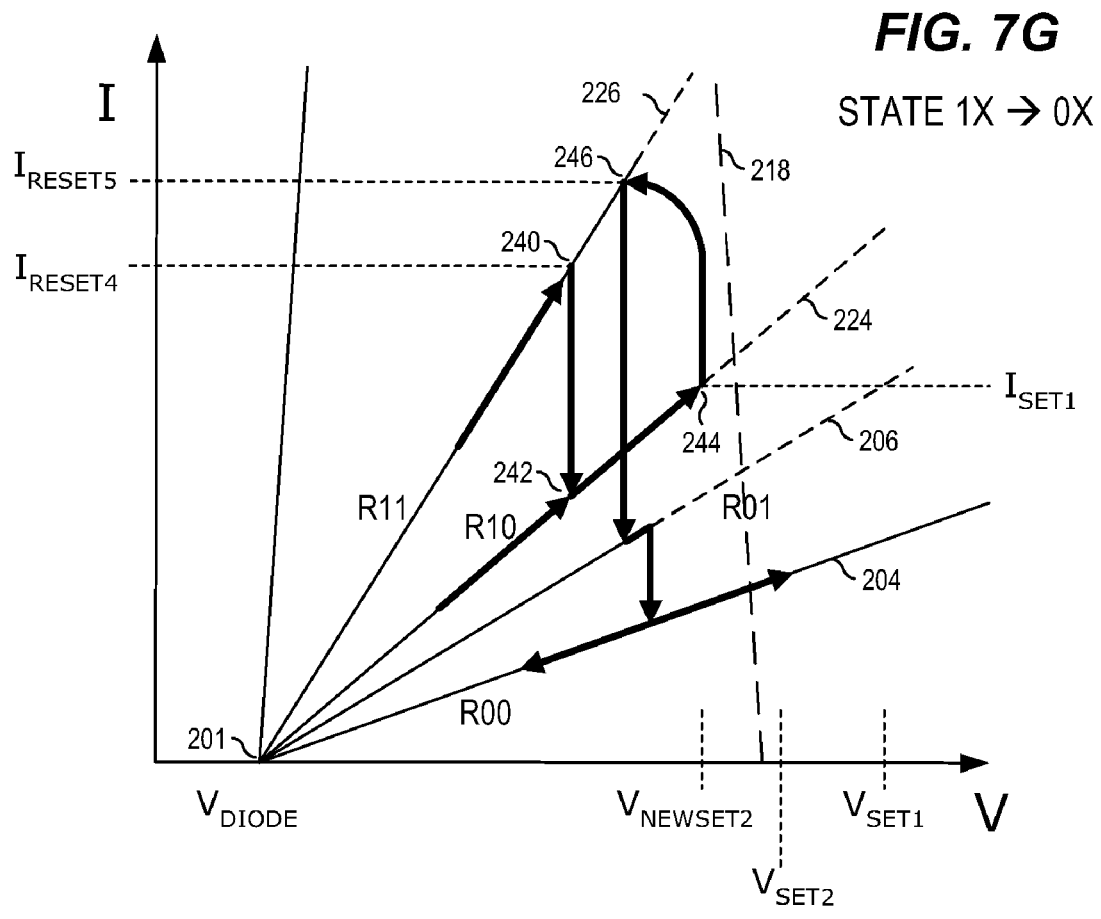

Referring now to FIG. 7G, the programming conditions "G" are depicted for resetting the first element, although this likely may result in an unpredictable state of the second element. This corresponds to the transition 187 from the 1X state 174 to the 0X state 171, to the transition 195 from the 11 state 176 to the 0X state 171, and to the transition 196 from the 10 state 175 to the 0X state 171. If the memory cell is currently in the R11 state, when sufficient voltage is applied across the memory cell, the bias point traverses up the R11 line 226 until reaching the memory cell bias point 240, at which point the second element is reset, and the bias point abruptly transitions down to the R10 line 224 at bias point 242. Alternatively, if the memory cell is currently in the R10 state, the bias point traverses up the R10 line 224 until reaching the memory cell bias point 242. Thereafter, in both cases, the bias point continues up the R10 line 224.

If a high enough voltage is applied across the memory cell, and if enough current is allowed to flow through the memory cell, the first element reset voltage and reset current may be reached. The voltage applied to the cell (i.e., $V_{APPLIED}$) to achieve programming condition "G" is high enough to adjust the diode load line 218 so that it intersects the R10 line 224 at a higher voltage than point 244, thereby causing a transition from the R10 line at point 244 to state R11 at or above point 246 where the current exceeds the $I_{RESET5}$ current. In other words, as the bias point traverses up the R10 line 224 to bias point 244, the first element exceeds its set current $I_{SET1}$ and its set voltage (corresponding to the memory cell voltage $V_{NEWSET2}$), and the bias point abruptly transitions upward toward the R11 line 226. If the memory cell current reaches the reset current for the first element (shown here as $I_{RESET5}$ at bias point 246), the first element resets back to its high resistance state, which may cause the bias point to drop down to at least the R01 line 206. The second element may also have reset to its high resistance state as a result of this bias condition, so that the memory cell bias point may drop down to the R00 line 204.

It may not be necessary to even limit the current during this operation, because the cell current must at least reach the reset current $I_{RESET5}$. However, if the cell current is limited during this operation, the limit should be chosen so that $I_{LIMIT} > I_{RESET5}$. It is important that the voltage across the memory cell is not allowed to reach the $V_{SET2}$ voltage (also seen in FIG. 7A), at which point the second element would switch right back to its set state. This cannot be prevented by limiting the programming current to a value below $I_{SET}$, because the reset current $I_{RESET5}$ that must be allowed to flow through the memory cell to accomplish the reset is greater than the set current $I_{SET1}$. However, by choosing an appropriate diode load line 218, the maximum voltage along the R00 line 204 that can be reached after the second element resets can be limited to a value less than the $V_{SET2}$ voltage, and thus ensure that the second element remains reset. The voltage at which the diode load line 218 crosses the R00 line 204 is chosen by application of a $V_{APPLIED}$ voltage that is applied across the cell from bit line to word line. The $V_{APPLIED}$ voltage may be higher than the $V_{SET2}$ voltage depending on the diode turn-on voltage and the slope of the diode current-versus-voltage characteristic. For example, the $V_{APPLIED}$ voltage may be about one volt higher than the $V_{SET2}$ voltage and still limit the bias point voltage on the R00 line 204 to less than the $V_{SET2}$ voltage. The $V_{APPLIED}$ voltage is also chosen to limit the voltage on the R01 line 206 to less than the $V_{SET1}$ voltage so the first element remains set as the cell transitions from point 246 on the R11 line 226 to the R10 state and then to the R00 state, as shown by the bold arrows extending downward from point 246. Of note, the $V_{APPLIED}$ voltage is chosen to ensure that the diode load line 218 intersects the R11 line 226 and the R10 line 224 above the two reset voltages, but intersects the R00 line 204 and the R01 line 206 below the two set voltages. A complex and perhaps unpredictable set of transitions occurs, but eventually the R00 state may be achieved.

It may be necessary to perform more than one programming operation before both elements stabilize in their high resistance (reset) state (i.e., the R00 line 204) because of the time to achieve the complex and unpredictable transition, circuit noise, and variations or manufacturing variability of diodes and switching elements. In some embodiments, the memory cell may be read after the programming operation "G" is performed, and if not in the R00 state, one or more additional programming operations "G" may be performed. These additional programming operations may be performed with a modified $V_{APPLIED}$ voltage, either higher or lower than before, to achieve the desired R00 state.

Memory cells as described above thus exhibit a resistance which is programmable to one of four different values. Such a memory cell may be read by application of a much lower read voltage $V_{READ}$, and sensing among the four separate read currents that result from the four resistance values. The conductivity of the diode at $V_{READ}$ does not change after the application of the programming voltage pulses, so the different read current levels derive from the two bi-stable resistor elements. Exemplary methods for reading such a memory array are described in U.S. Publication No. 2008-0025088 entitled "Apparatus for Reading a Multi-Level Passive Element Memory Cell Array" by Roy E. Scheuerlein, et al., and in U.S. Pat. No. 7,345,907 entitled "Apparatus and Method for Reading an Array of Nonvolatile Memory Cells Including Switchable Resistor Memory Elements" by Roy E. Scheuerlein, the disclosures of which are hereby incorporated by reference in their entirety.

Useful X-line and Y-line decoder structures and techniques, including additional hierarchical levels of such decoding, bias circuit organization for the decoded busses, and related supporting circuits, are described in the following documents, each of which is hereby incorporated by reference in its entirety: U.S. Pat. No. 6,856,572 to Roy E. Scheuerlein, et al., entitled "Multi-Headed Decoder Structure Utilizing Memory Array Line Driver with Dual Purpose Driver Device;" U.S. Pat. No. 6,859,410 to Roy E. Scheuerlein, et al., entitled "Tree Decoder Structure Particularly Well-Suited to Interfacing Array Lines Having Extremely Small Layout Pitch;" U.S. Pat. No. 7,286,439 to Luca G. Fasoli, et al., entitled "Apparatus and Method for Hierarchical Decoding of Dense Memory Arrays Using Multiple Levels of Multiple-Headed Decoders;" U.S. Pat. No. 7,142,471 to Luca G. Fasoli, et al., entitled "Method and Apparatus for Incorporating Block Redundancy in a Memory Array;" and U.S. Patent Publication No. 2008-0025066 by Luca G. Fasoli, et al., entitled "Passive Element Memory Array Incorporating Reversible Polarity Word Line and Bit Line Decoders."

There are many different materials that may be useful for this invention, including titanium oxide, hafnium oxide, aluminum oxide, nickel oxide, other transition metal oxides, and complex metal oxides. The resistor elements need not be homogenous films, but could be a combination of switchable resistor materials. For example, two different materials may be chosen from a wide variety of materials, such as metal oxides, phase change materials, switchable thin carbon layers, graphene layers, carbon nanotube layers, microcrystalline carbon layers, thin film silicon, antifuse, fuse, polysilicon memory effect element, conductive bridge element, doped solid electrolyte, switchable polymer element, recrystallized silicon, or other switchable resistance element materials. Resistive elements may be initially manufactured in their high-resistance (reset) state, but need not necessarily be so. Also, it is desirable to utilize bi-stable resistive elements whose set voltage is greater than its reset voltage, because it is easier to achieve a high voltage across a resistor when in its high resistance state than its low resistance state. Achieving two bi-stable resistor elements having non-overlapping (and widely-enough spaced) set and reset currents may result from using different materials, or may result from using the same material, but different in film thickness or cross-sectional area of the memory element.

Because the method described above involves writing a first element before writing a second element, it is desirable for controller logic to ensure that the first element is written before the second element. For example, an off chip controller may be configured to keep track of physical address space and ensure that the first element is written before the second element. If the first element is later written by the system, the location written can be redirected to a new location so that no already written data is disturbed. In a page-based memory, the first and second elements may be written in the same page operation, and on chip circuits used to ensure that the first element is written before the second element. Alternatively, the first and second elements may be allowed to be written in any order, but just before a first element is written, the second element is temporarily stored and then rewritten after first element is written. Control of such temporary storage and rewriting may be performed on-chip, in a memory controller chip, or by some other appropriate control mechanism. In a page-oriented memory, a flag may be written into a page for which none of the second elements have been written. Thus, upon reading such an "all ones flag" a controller could then skip the temporary storage and subsequent rewriting of the second element data, and thus speed up programming of the first element data.

In a page-oriented memory device, each memory cell may be configured to store data from different pages. In other words, the first bi-stable resistor element in a given memory cell may store a data bit from one page, and the second bi-stable resistor element in the given memory cell may store a data bit from another page. Alternatively, both data bits may reside within the same page, as is also described in the aforementioned U.S. Publication No. 2008-0025088.

As used herein, a bi-stable resistive element includes a defined piece of a film layer that exhibits bi-stable switching, and does not imply that such material must literally be a homogenous element from the periodic table. As used herein, coupled means either directly or indirectly.

As used herein, a "voltage/current condition" applied on a memory cell includes a combination of a particular voltage condition and a particular current condition. An example of such a voltage condition includes impressing a voltage of at least a certain magnitude across a memory cell. Another example includes impressing a voltage whose magnitude falls within a particular range across the memory cell. An example of a particular current condition includes allowing any amount of current to flow but only up to a particular magnitude of current (i.e., limiting the current to a particular value).

Most memory arrays are designed having a relatively high degree of uniformity. For example, usually every bit line includes the same number of memory cells. As another example, the number of bit lines, word lines, array blocks, and even memory planes is frequently an integral power of two in number (i.e., $2^N$), for ease and efficiency of decode circuitry. But such regularity or consistency is certainly not required.

As used herein, a passive element memory array includes a plurality of 2-terminal memory cells, each connected between an associated X-line (e.g., word line) and an associated Y-line (e.g., bit line). Such a memory array may be a two-dimensional (planar) array or may be a three-dimensional array having more than one plane of memory cells. Each such memory cell has a non-linear conductivity in which the current in a reverse direction (i.e., from cathode to anode) is lower than the current in a forward direction. A passive element memory array may be a one-time programmable (i.e., write once) memory array or a read/write (i.e., write many) memory array. Such passive element memory cells may generally be viewed as having a current steering element directing current in a direction and at least one other component which is capable of changing its state (e.g., a fuse, an antifuse, a capacitor, a resistive element, a bi-stable resistive element, etc.). The programming state of the memory cell can be read by sensing current flow or voltage drop when the memory cell is selected.

A current source (i.e., also "constant current" source) may be viewed as a circuit providing generally a constant current irrespective of the voltage impressed across the device. Examples include a current mirror circuit. In many such practical constant current circuits, the magnitude of the "constant" current may diminish as the voltage across the circuit is reduced. A "current limiting circuit" may also be thought of as such a constant current source, although the "current limiting" terminology acknowledges that the constant current may decrease for some bias voltages thereacross, but the current therethrough is nonetheless limited to a maximum magnitude for all such biases.

As used herein, a node which is "biased to a voltage higher than X" may mean that the node is coupled to a voltage source through a constant current or current limiting circuit, such that the voltage developed on the biased node is indeed higher than X, but not necessarily of a predictable or fixed voltage value. As used herein, "coupling a node to a voltage" may include one or more intervening devices, such that the node may not necessarily reach the voltage. For example, a node may be coupled to a first voltage through a current limiting circuit, and possibly through one or more selection devices.

As used herein, the SET state is assumed to be a low-resistance state, while the RESET state is assumed to be a high-resistance state. The SET action is for programming the memory cell resistor to the SET state; likewise the RESET action is for programming the memory cell resistor to the RESET state.

The phrases "programming a memory element to a set state" and "programming the switchable resistor memory element within a memory cell to a set state" and "programming a memory element to a low-resistance state" and "programming the switchable resistor memory element within a memory cell to a low-resistance state" may be used interchangeably herein, and no subtle distinctions should be inferred from such use.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array. In some embodiments, the memory cells may be formed entirely in layers formed above a semiconductor substrate or a non-semiconductor substrate.

In most preferred embodiments, memory array support is formed in the substrate beneath the memory, and electrical connections must be made from the ends of the data lines, reference lines, and select lines of the array to this circuitry. An advantageous scheme for making these connections while minimizing use of substrate area is described in Scheuerlein et al., U.S. Pat. No. 6,879,505, "Word Line Arrangement Having Multi-Layer Word Line Segments for Three-Dimensional Memory Array," owned by the assignee of the present invention and hereby incorporated by reference.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Nonetheless, in the interest of clarity, not all of the routine features of the implementations described herein are shown and described. It should, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

For example, decisions as to the number of memory cells within each array or sub-array, the particular configuration chosen for word line and bit line pre-decoder and decoder circuits and bit line sensing circuits, as well as the word organization, are all believed to be typical of the engineering decisions faced by one skilled in the art in practicing this invention in the context of developing a commercially-viable product. As is well known in the art, various row and column decoder circuits are implemented for selecting a memory block, and a word line and bit line within the selected block, based upon address signals and possibly other control signals.

Nonetheless, even though a mere routine exercise of engineering effort is believed to be required to practice this invention, such engineering efforts may result in additional inventive efforts, as frequently occurs in the development of demanding, competitive products.

While circuits and physical structures are generally presumed, it is well recognized that in modern semiconductor design and fabrication, physical structures and circuits may be embodied in computer readable descriptive form suitable for use in subsequent design, test or fabrication activities as well as in resultant fabricated semiconductor integrated circuits. Accordingly, claims directed to traditional circuits or structures may, consistent with particular language thereof, read upon computer readable encodings and representations of same, whether embodied in media or combined with suitable reader facilities to allow fabrication, test, or design refinement of the corresponding circuits and/or structures. The invention is contemplated to include circuits, related methods or operation, related methods for making such circuits, and computer-readable medium encodings of such circuits and methods, all as described herein, and as defined in the appended claims. As used herein, a computer-readable medium may include a storage medium such as a disk, tape, or other magnetic, optical, semiconductor (e.g., flash memory cards, ROM), or electronic medium. A computer-readable medium may also include a transiently encoded form suitable for transmission via a network, wireline, wireless, or other communications medium. An encoding of a circuit may include circuit schematic information, physical layout information, behavioral simulation information, and/or may include any other encoding from which the circuit may be represented or communicated.

The foregoing detailed description has described only a few of the many possible implementations of the present invention. For this reason, this detailed description is intended by way of illustration, and not by way of limitation. Variations and modifications of the embodiments disclosed herein may be made based on the description set forth herein, without departing from the scope and spirit of the invention. Moreover, the embodiments described above are specifically contemplated to be used alone as well as in various combinations. It is only the following claims, including all equivalents, that are intended to define the scope of this invention. Accordingly, other embodiments, variations, and improvements not described herein are not necessarily excluded from the scope of the invention.

What is claimed is:

1. A memory device comprising:
   a cross-point memory array comprising a plurality of array lines of a first type and a plurality of array lines of a second type, and a plurality of two-terminal memory cells each coupled between an associated array line of the first type and an associated array line of the second type;
   wherein each memory cell comprises a first bi-stable resistive element, a second bi-stable resistive element, and a current-steering device coupled together in series;
   wherein each bi-stable resistive element is settable from a high to a low resistance value, and resettable from a low to a high resistance value;
   wherein the first bi-stable resistive element, when in its high resistance state, is settable to its low resistance state by the passage of a set current therethrough, and when in its low resistance state, is resettable to its high resistance state by the passage of a reset current therethrough;
   wherein the second bi-stable resistive element, when in its high resistance state, is settable to its low resistance state by the passage of a set current therethrough, and when in its low resistance state, is resettable to its high resistance state by the passage of a reset current therethrough; and
   wherein the set current and reset current of the first bi-stable resistive element are both greater than the set current and reset current of the second bi-stable resistive element.

2. The device as recited in claim 1 wherein:
   each of the first and second bi-stable resistive elements respectively comprises a set voltage corresponding to its set current, and respectively comprises a reset voltage corresponding to its reset current; and
   for each of the first and second bi-stable resistive elements, its set voltage is higher than its reset voltage, so that when one of the first and second bi-stable resistive elements is in its low resistance state, a high set voltage may be more easily developed across the other of the first and second bi-stable resistive elements.

3. The device as recited in claim 1 further comprising a support circuit external to the memory array for storing a data state of one or more of said second resistive elements during programming of one or more of said first resistive elements.

4. The device as recited in claim 1 wherein the first element is used to store a first bit of information, and the second element is used to store a second bit of information.

5. The device as recited in claim 4 wherein the first bit of information and the second bit of information are both programmed in the same page operation.

6. The device as recited in claim 4 wherein the first bit of information and the second bit of information fall within the same page.

7. The device as recited in claim 1 wherein the first element and the second element respectively comprise two different layers of the same bi-stable resistance material, wherein the two layers differ in thickness, or the first and second elements differ in cross sectional area, or both.

8. A method for programming a two-terminal cross-point memory cell within a memory array with multiple data bits, said memory cell comprising first and second bi-stable resistive elements coupled in series with a current-steering device, each bi-stable resistive element being settable from a high to a low resistance value, and resettable from a low to a high resistance value, said method comprising:
   (a) applying one of a first group of voltage/current conditions on the memory cell to program the first bi-stable resistive element to a desired data state, even though such voltage/current conditions may result in an unpredictable data state written to the second bi-stable resistive element; and then
   (b) applying one of a second group of voltage/current conditions on the memory cell to program the second bi-stable resistive element to a desired data state without disturbing the data state of the first bi-stable resistive element, wherein current flow through the memory cell is limited in each of the second group of voltage/current conditions to a smaller magnitude than in any of the first group of voltage/current conditions.

9. The method as recited in claim 8 further comprising:
   (c) reading the memory cell before step (a) to determine the data state of the second bi-stable resistive element, and storing the data state in a support circuit external to the memory array; and
   wherein the desired data state in step (b) corresponds to the stored data state previously read from the second bi-stable resistive element.

10. The method as recited in claim 9 further comprising:
performing step (c) if a second bi-stable resistive element within a memory page including the memory cell has previously been programmed; and
skipping step (c) otherwise.

11. The method as recited in claim 10 further comprising:
reading a flag bit to indicate whether a second bi-stable resistive element within the memory page including the memory cell has previously been programmed.

12. The method as recited in claim 8 wherein one of the first group of voltage/current conditions comprises:
(c) impressing at least a first voltage across the memory cell while limiting current through the memory cell to a first current limit, to write the first element to a first data state.

13. The method as recited in claim 12 wherein:
the first current limit is less than a first reset current corresponding to the first element but greater than a first set current corresponding to the first element.

14. The method as recited in claim 12 wherein one of the second group of voltage/current conditions comprises:
(d) impressing at least a second voltage across the memory cell while limiting current through the memory cell to a second current limit, to write the second element to a known data state;
wherein the second voltage is smaller than the first voltage; and
wherein the second current limit is smaller than the first current limit.

15. The method as recited in claim 14 wherein step (d) comprises:
developing a second set voltage across the memory cell while limiting current through the memory cell to a value greater than a second set current and less than a second reset current, to program the second element to its low resistance data state; and
developing a second reset voltage across the memory cell and allowing current greater than the second reset current to flow through the memory cell, but preventing the voltage across the memory cell from reaching the second set voltage, to program the second element to its high resistance data state;
wherein the second reset voltage is less than the second set voltage, and the second set current is less than the second reset current.

16. The method as recited in claim 15 wherein one of the first group of voltage/current conditions comprises:
(e) developing a voltage across the memory cell greater than the second set voltage but less than the first set voltage, and allowing at least a fifth reset current to flow through the memory cell, to program the first element to its high resistance data state.

17. The method as recited in claim 16 further comprising:
(f) repeating step (e) if the second element is not also programmed to its high resistance data state.

18. The method as recited in claim 14 wherein the first element and the second element respectively comprise two different layers of the same bi-stable resistance material, wherein the two layers differ in thickness, or the first element and second element differ in cross sectional area, or both.

19. The method as recited in claim 14 further comprising programming a first bit of information in the first element, and programming a second bit of information in the second element.

20. The method as recited in claim 19 further comprising programming both the first bit of information and the second bit of information in the same page operation.

21. The method as recited in claim 19 wherein the first bit of information and the second bit of information fall within the same page.

22. A method for programming a two-terminal cross-point memory cell with multiple data bits, said memory cell comprising first and second bi-stable resistive elements coupled in series with a current-steering device, each bi-stable resistive element being settable from a high to a low resistance value by the passage of a set current therethrough, and resettable from a low to a high resistance value by the passage of a reset current therethrough, said method comprising:
(a) causing a current to flow through the memory cell that exceeds one of the set and reset current for the element having a higher reset current, to program said element having the higher reset current; then
(b) causing a lesser current to flow through the memory cell to program the element having the lower reset current.

23. The method as recited in claim 22 further comprising:
(c) reading the memory cell before step (a) to determine the data state of the element having the lower reset current, and storing the data state in a support circuit external to the memory array; and
(d) programming the element having the lower reset current in step (b) with the stored data state.

24. A method for making a memory product, said method comprising:
forming a cross-point memory array comprising a plurality of array lines of a first type and a plurality of array lines of a second type, and a plurality of two-terminal memory cells each coupled between an associated array line of the first type and an associated array line of the second type;
wherein each memory cell comprises a first bi-stable resistive element, a second bi-stable resistive element, and a current-steering device coupled together in series;
wherein each bi-stable resistive element is settable from a high to a low resistance value, and resettable from a low to a high resistance value;
wherein the first bi-stable resistive element, when in its high resistance state, is settable to its low resistance state by the passage of a set current therethrough, and when in its low resistance state, is resettable to its high resistance state by the passage of a reset current therethrough;
wherein the second bi-stable resistive element, when in its high resistance state, is settable to its low resistance state by the passage of a set current therethrough, and when in its low resistance state, is resettable to its high resistance state by the passage of a reset current therethrough; and
wherein the set current and reset current of the first bi-stable resistive element are both greater than the set current and reset current of the second bi-stable resistive element.

* * * * *

UNITED STATES PATENT AND TRADEMARK OFFICE
CERTIFICATE OF CORRECTION

PATENT NO. : 7,961,494 B2
APPLICATION NO. : 12/242417
DATED : June 14, 2011
INVENTOR(S) : Roy E. Scheuerlein It is certified that error appears in the above-identified patent and that said Letters Patent is hereby corrected as shown below:

Col. 2, line 14, please replace "2007-0228359" with --2007-0228354--
Col. 4, line 63, please replace "H. Si, et al.," with --H. Sim, et al.,--

Signed and Sealed this
Second Day of August, 2011

David J. Kappos
*Director of the United States Patent and Trademark Office*